United States Patent [19]

Imanishi et al.

[11] 4,354,686
[45] Oct. 19, 1982

[54] CONTACT-FREE SEALING MEMBER

[75] Inventors: Kiyokazu Imanishi, Higashiosaka; Takashi Ichiyanagi, Hirakata, both of Japan

[73] Assignee: Matsushita Electric Industrial Co., Ltd., Kadoma, Japan

[21] Appl. No.: 163,475

[22] Filed: Jun. 27, 1980

[30] Foreign Application Priority Data

Jul. 6, 1979 [JP] Japan .................................. 54-86180
Aug. 17, 1979 [JP] Japan ................................ 54-105298

[51] Int. Cl.³ .............................................. F16J 15/40
[52] U.S. Cl. ........................................ 277/3; 34/242; 242/182; 226/97
[58] Field of Search ................. 226/97; 242/173, 182, 242/183; 34/242; 277/3, 32, 237 R

[56] References Cited

U.S. PATENT DOCUMENTS

| 3,245,334 | 4/1966 | Long . | |
|---|---|---|---|
| 3,383,888 | 5/1968 | Aschberger | 226/97 |
| 3,514,024 | 5/1970 | Hawkins | 226/97 |
| 3,533,245 | 10/1970 | Komberec et al. | 34/242 |
| 3,706,138 | 12/1972 | Schuierer | 34/242 |
| 3,762,619 | 10/1973 | Leavitt et al. | 226/97 |
| 3,891,223 | 6/1975 | Sonnen | 34/242 |
| 4,112,713 | 9/1978 | Sando | 34/242 |
| 4,122,504 | 10/1978 | Prozzo et al. | 242/182 |
| 4,245,844 | 1/1981 | Pohl et al. | 277/3 |
| 4,257,617 | 3/1981 | Hill | 277/3 |

FOREIGN PATENT DOCUMENTS 736857 7/1969 Belgium .
2307202 5/1976 France .

Primary Examiner—Robert I. Smith
Attorney, Agent, or Firm—Cushman, Darby & Cushman

[57] ABSTRACT

An improved contact-free sealing member for sealing an isolated chamber comprising a slot path for passing a tape therethrough, wherein a hydrostatic gas bearing is produced in a slot path formed in the sealing member so as to provide a contact-free tape feeding through the slot path and a superior sealing effect by the sealing member.

13 Claims, 20 Drawing Figures

F I G. 12 (a)
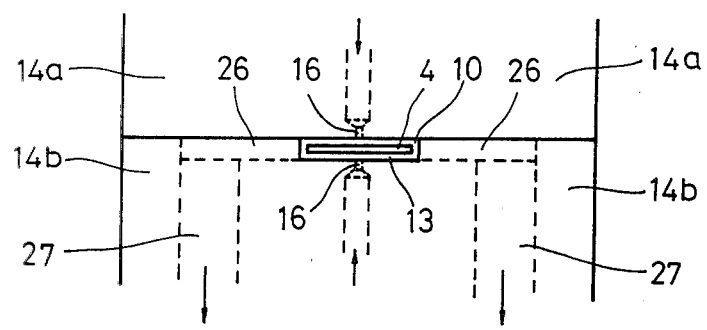
F I G. 12 (b)
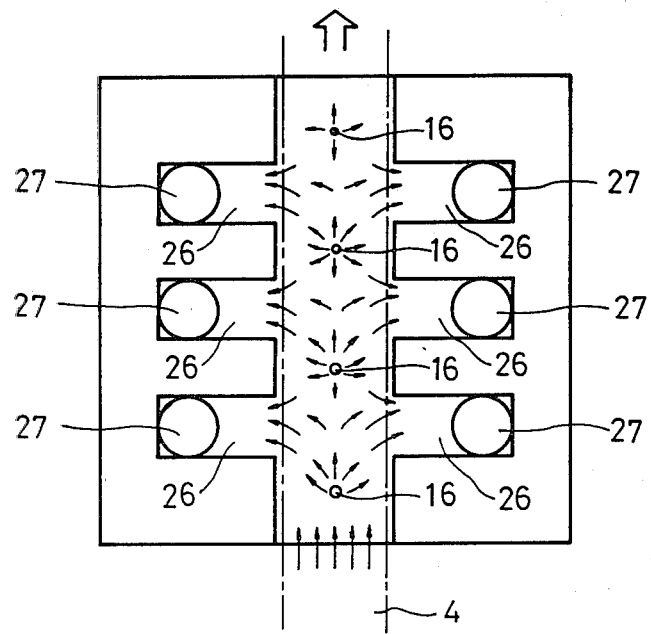

F I G.13(b)
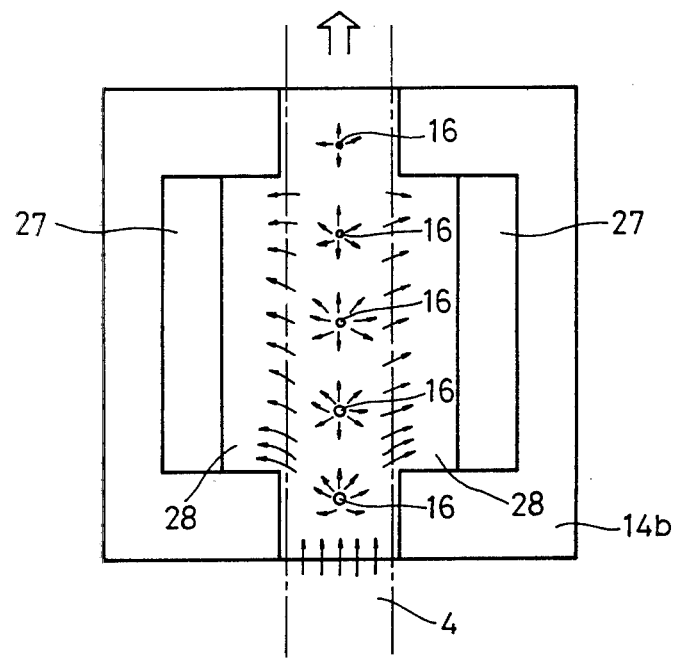
F I G.14
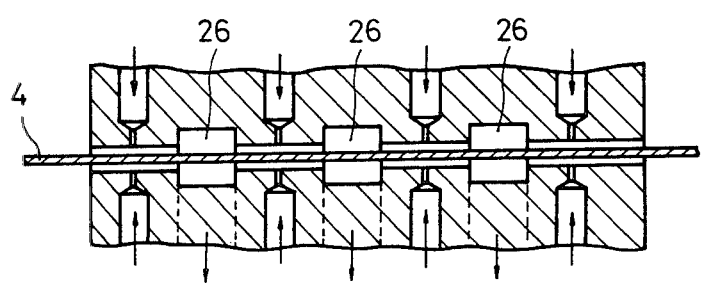

4,354,686

CONTACT-FREE SEALING MEMBER

BACKGROUND OF THE INVENTION

1. Field of the Invention

The present invention relates to an improvement in a contact-free sealing member used for sealing an isolated chamber, into which a material such as plastic film tape is continuously fed at a high speed.

2. Description of the Prior Art

In a winding apparatus a tape is continuously wound by a winding reel at a high speed. When the winding speed exceeds a certain level, the air surrounding the tape is successively sucked in a narrow space between a roll of the wound tape at the winding reel and a part of the tape to be wound. As a result of the air suction, the tape receives a floating force caused by an unstable compressed air film due to wedge action or squeeze action effect. In addition, the feeding tape is also subjected to an irregular external force such as variations of the tape tension arising from the eccentric rotation of the reel and/or mechanical vibrations of mechanical portions in the winding apparatus. As a result of such an irregular force, the tape vibrates in the widthwise direction thereof and accordingly there arises irregularities of winding, i.e., uneven winding of the side portions of the tape. For example, in the case of the tape of ½ inch width this winding trouble appears when it is wound at a speed more than 5–6 m/sec. When the tape is unevenly wound, not only the appearance of the wound tape becomes indecent, but also the tape gets curly. Therefore, the tape becomes liable to be damaged and further the feeding operation of the tape becomes unstable when it is used for playback.

SUMMARY OF THE INVENTION

The present invention is for providing an improved structure of a contact-free sealing member for sealing an isolated chamber, into which a thin material can be continuously fed at a high speed without contact problems with the inner face of the sealing member.

BRIEF DESCRIPTION OF THE DRAWINGS

FIG. 5($b$) is a cross-sectional side view of the feeding path of FIG. 5($a$).

FIG. 6($b$) is a cross-sectional front view taken on line A—A of FIG 6($a$).

FIG. 7($b$) is a cross-sectional front view taken on line B—B of FIG. 7($a$).

FIG. 14 is a cross-sectional side view showing a modified contact-free sealing member embodying the present invention.

DESCRIPTION OF THE PREFERRED EMBODIMENTS

The present invention provides a contact-free sealing member for sealing an isolated chamber which comprises a slot path for passing a tape therethrough and disposed on a wall part of said isolated chamber, a cross-sectional area of said slot path being larger than that of said tape.

The present applicant (Matsushita Electric Industrial Co., Ltd.) has proposed in her senior application (filed on Mar. 5, 1980 under Ser. No. 127,529 in U.S.A., on Mar. 10, 1980 under application number P 3,009,123.7 in Fed. Rep. of Germany, and on Mar. 7, 1980 under application number 347,261 in Canada, those being not yet published nor disclosed) to provide a method and an apparatus for winding a tape in a chamber at a pressure lower than the atmospheric pressure.

Figure 1:
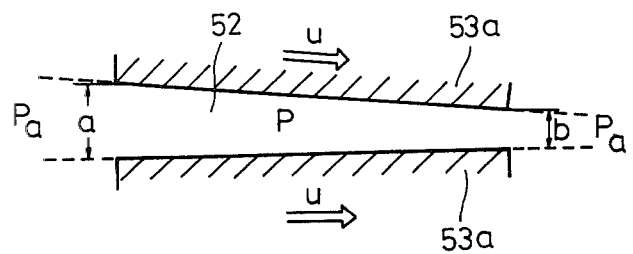
FIG. 1 is a cross-sectional view showing a model for a winding part used for a model analysis of the irregular winding phenomenon in a conventional winding.
Figure 2:
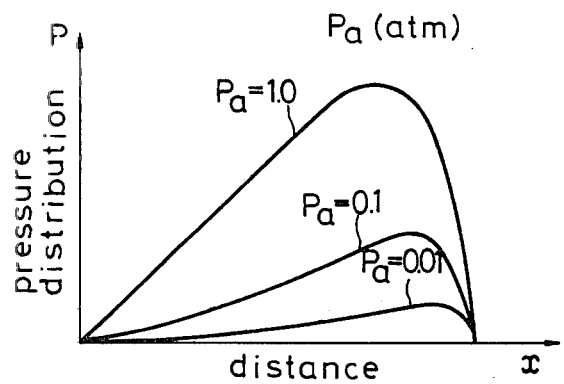
FIG. 2 is a graph showing pressure distribution within the inlet and the outlet clearances of the modeled winding part of FIG. 1.
Figure 3:
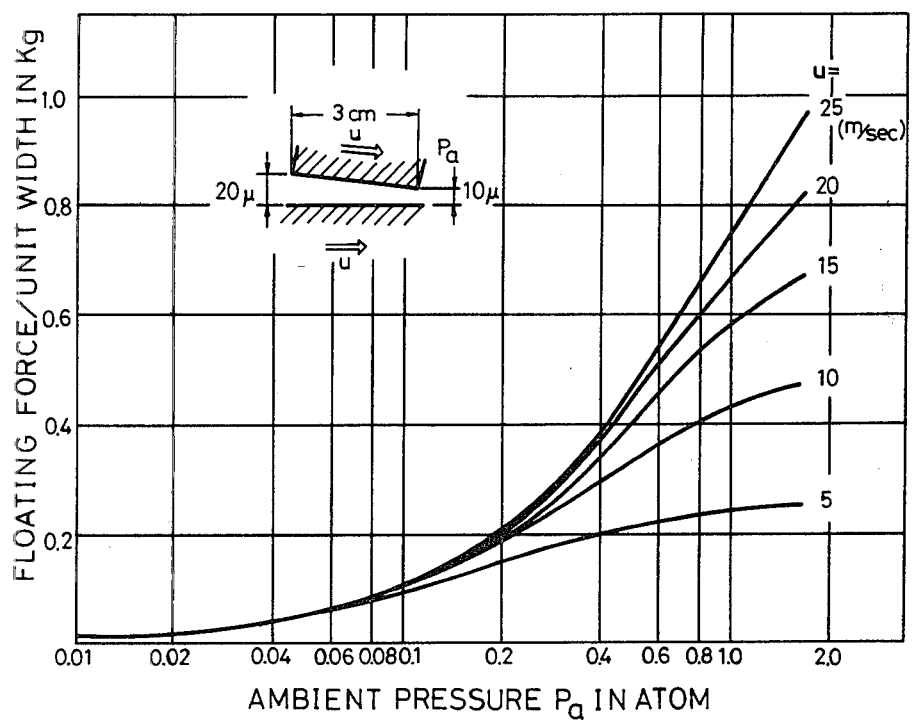
FIG. 3 is a graph showing a relationship between an ambient pressure and a generated floating force in the model of FIG. 1, taking a tape speed U as a parameter.

The tape winding part is modeled in FIG. 1. Suppose that two planes 53$a$ and 53$b$ of infinite width move at a speed U in the direction indicated by the arrows, and that they define a small tapered clearance 52 such that an inlet side clearance a is larger than an outlet side clearance b. The variation of the pressure P generated in the clearance in relation to the ambient pressure $P_a$ may be calculated as a function of distance from the inlet side clearance a by the finite difference method as a compressive fluid lubrication problem. As a result, it is found that the generated pressure P decreases as the ambient pressure $P_a$ decreases. FIG. 3 shows the relation between the ambient pressure $P_a$ and the generated floating force calculated by integrating the pressure distribution shown in FIG. 2, taking the speed U as a parameter.

It is seen from FIG. 3, that the floating force per unit length in the lateral direction decreases as the ambient pressure decreases, and that it is not much affected by the speed U when the ambient pressure is below 0.1 atm.

The above results are obtained by simple calculations using the model shown in FIG. 1. In the case of an actual tape winding part, the tape width, the tape tension, the bending rigidity and so on are involved, complicating the matter. However, in principle it is understood that the floating force decreases as the ambient pressure is reduced.

Figure 4:
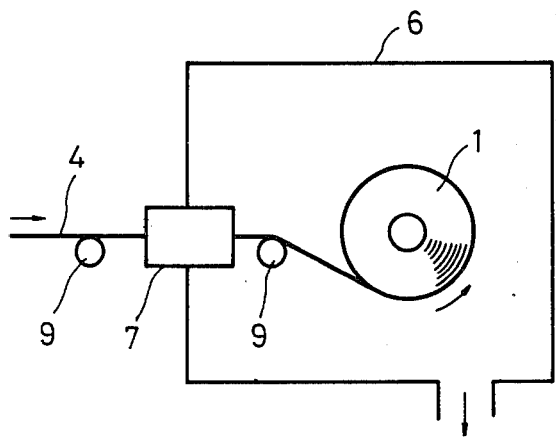
FIG. 4 is a view schematically showing a winding apparatus comprising a reduced pressure chamber.

FIG. 4 is a schematic view showing one example of a winding apparatus with a reduced pressure chamber as proposed in the abovementioned senior application. A winding apparatus with a reduced pressure chamber 6 provided with a sealing member 7 is proposed in the abovementioned senior application. A tape 4 is wound by a reel 1 at a speed of around 10 m/sec and with a tension of several 10 g. Tape guides 9 are used for guiding the path of the feeding tape. By employing the reduced pressure chamber 6, it is possible to wind the tape 4 at a high speed and besides with a small tension.

It is further proposed in the senior application to use a sealing member with two pinch rollers in order to prevent the outside air from flowing into a reduced pressure chamber. In such a sealing member the sealing is well preserved since a tape directly contacts the pinch rollers. But the tape is liable to be damaged at the surface thereof, and further it is difficult to control the feeding tension of the tape and to stabilize the feeding operation.

Figure 5A:
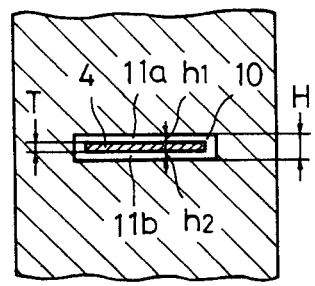
FIG. 5($a$) is a cross-sectional front view of a sealing member provided with a feeding path.
Figure 5B:
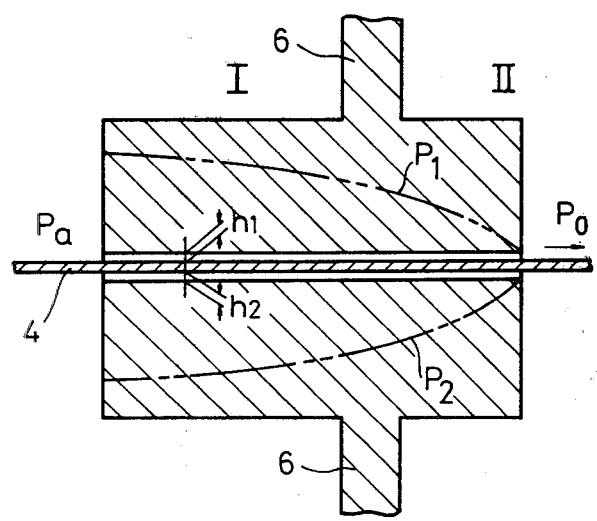

It is also pointed out in the senior application that it is preferable to use a contact-free sealing member. Such a contact-free sealing member is shown in FIG. 5(a) and FIG. 5(b). FIG. 5(a) is a cross-sectional front view of a sealing member provided with a feeding path 10 of a long and slender shape having an opening height of H slightly larger than a thickness T of a tape 4. A sealing effect is obtainable by the viscosity resistance of the air at small spaces $11a$ and $11b$, which are respectively formed between wall faces of the feeding path 10 and both faces of the tape 4.

Further, it is now known to employ a labyrinth seal to obtain the sealing effect, in which seal a cross-sectional area of a flow path is abruptly changed. But in such a contact-free seal including the conventional labyrinth seal, it is necessary to secure small clearances between objects under a relative movement, while retaining the sealing effect. But even though small clearances are available in a sealing member of a rigid body, a feeding tape to be wound is liable to get out of a right feeding position in the sealing member by a small external force. This is especially remarkable for a tape of good flexibility such as a polyester film. Therefore, it is difficult to always secure small clearances during the feeding of the tape.

This situation will be analyzed by referring to FIG. 5(b). FIG. 5(b) is a cross-sectional side view of a feeding path, a tape being fed therethrough from a side I of an atmospheric pressure of $P_a$ to a chamber side II of a reduced pressure of $P_0$. Suppose the feeding path is filled with a perfect viscous fluid, then the pressure distribution $p_1$ (as drawn in FIG. 5(b) with a dotted line) at the top face of the tape 4 and the pressure distribution $p_2$ at the bottom face of the tape 4 are identical even if the feeding position of the tape 4 is changed. In other words, even if small clearances $h_1$ and $h_2$ on both sides of the tape 4 is not equal to each other, the pressure distributions $p_1$ and $p_2$ are identical. This means that there arises no supporting force at the feeding position. Accordingly, the feeding tape 4 is liable to get out of the right position by an external force and to become in contact with the inner face of the feeding path. This unstable feeding sometimes causes a vibration of the feeding tape, and in worst cases leads to cutting off of the tape at feeding.

It is further proposed in the senior application to employ a contact-free sealing member by use of a hydrostatic gas bearing effect in order to prevent the air from flowing into a reduced pressure chamber.

Figure 6A:
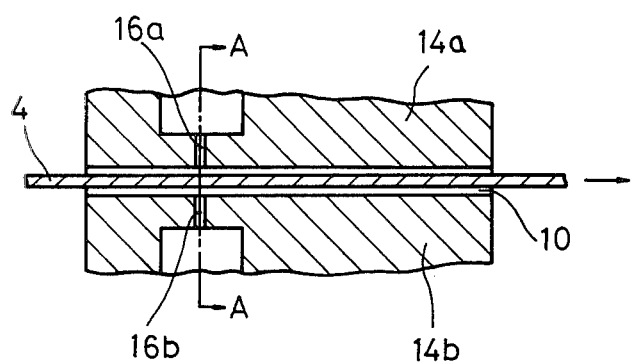
FIG. 6($a$) is a cross-sectional side view showing a contact-free sealing member embodying the present invention.
Figure 6B:
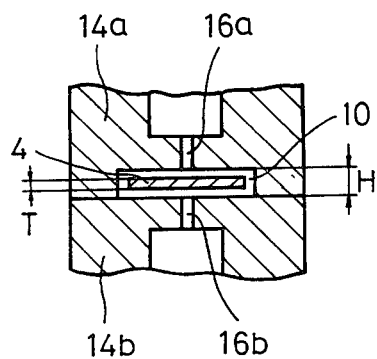

FIG. 6(a) is a cross-sectional side view showing a contact-free sealing member of a first embodiment embodying the present invention. FIG. 6(b) is a cross-sectional front view of the same taken along the line A—A in FIG. 6(a). The contact-free sealing member comprises an upper and a lower blocks $14a$ and $14b$, where a narrow slot path 10 is provided to feed a tape 4. Gas supply holes $16a$ and $16b$ are respectively formed on the upper and lower walls of the blocks $14a$ and $14b$. They oppose to each other via the tape 4. A gas is blown out from the gas supply holes $16a$ and $16b$ onto the surfaces of the tape 4 thereby forming a hydrostatic gas bearing. Therefore, the feeding position of the tape 4 is supported at the center of the slot path 10. It is preferable to design the size of a gap space formed between the upper or lower wall face of the slot path 10 and the upper or lower surface of the tape 4 as small as possible, in order to obtain a satisfactory sealing effect. Further, the gap size is set preferably below 100 μm, in order to make the gas fluid flow a laminar flow in the small space. This means that the difference between the size H of the slot path 10 and the thickness T of the tape 4 should be smaller than 200 μm. It is also naturally possible to form more than one pair of gas supply holes in the slot path 10.

Figure 7A:
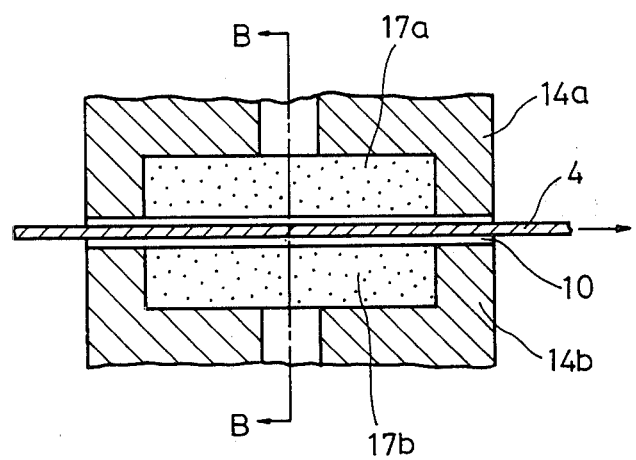
FIG. 7($a$) is a cross-sectional side view showing another contact-free sealing member embodying the present invention.
Figure 7B:
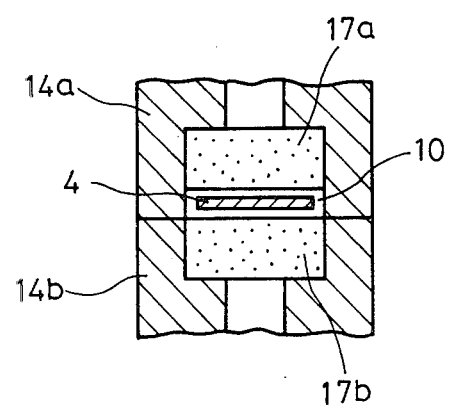

FIG. 7(a) is a cross-sectional side view showing a contact-free sealing member of a second embodiment embodying the present invention. FIG. 7(b) is a cross-sectional front view of the same taken along the line B—B in FIG. 7(a). In this embodiment a porous material is used to form a hydrostatic gas bearing in a slot path 10. This contact-free sealing member comprises an upper and a lower blocks $14a$ and $14b$ with portions $17a$ and $17b$ of a porous material such as sintered bronze. A gas is blown from the overall surface of the porous portions $17a$ and $17b$ onto the surfaces of a tape 4 thereby supporting the tape 4 in the middle of the slot path 10.

Figure 8:
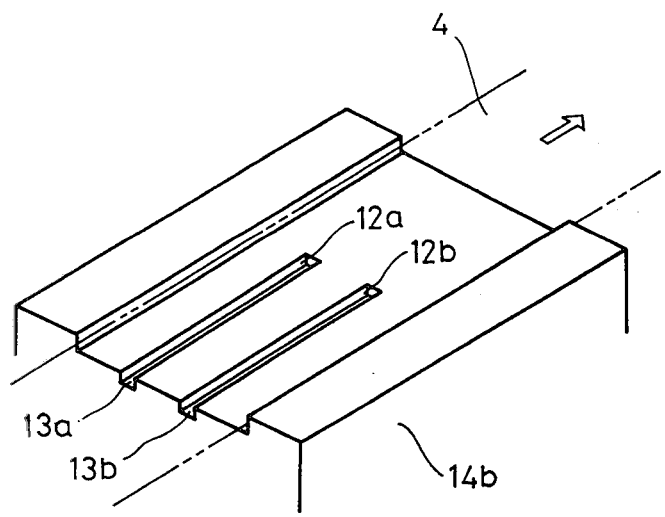
FIG. 8 is a perspective view showing a bottom portion of a contact-free sealing member embodying the present invention.
Figure 9:
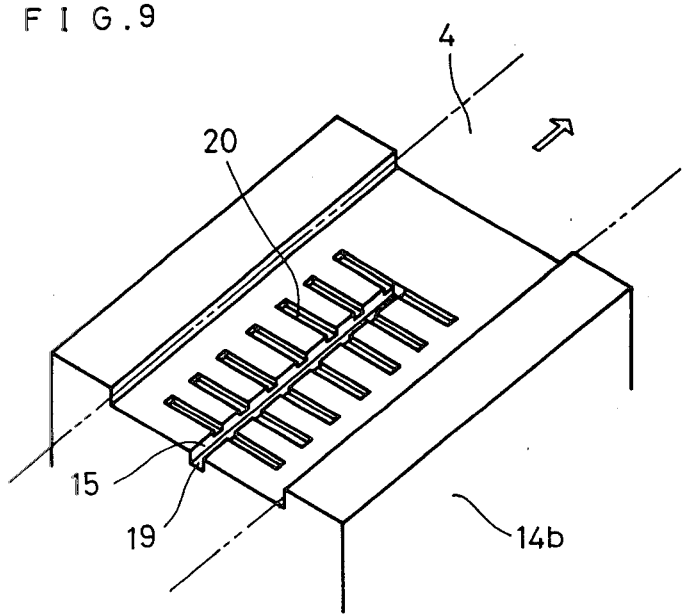
FIG. 9 is a perspective view showing a bottom portion of a contact-free sealing member embodying the present invention.

Similar hydrostatic gas bearing of surface restricter type can also be obtained in the following embodiments as shown in FIG. 8 and FIG. 9. FIG. 8 is a perspective view showing a bottom portion $14b$ of a contact-free sealing member of a third embodiment. The bottom portion $14b$ is provided with several grooves $12a$ and $12b$ of a pattern as shown in FIG. 8. Another similar portion to the bottom portion $14b$ is used for an upper portion thus constituting a slot path with the grooves for feeding a tape 4 therethrough. Ends $13a$ and $13b$ of the grooves $12a$ and $12b$ are opened to the atmospheric pressure side.

FIG. 9 is a perspective view showing a bottom portion $14b$ of a contact-free sealing member of a fourth embodiment. The bottom portion $14b$ is similarly provided with several grooves of a pattern as shown in FIG. 9. The grooves are a lengthwise groove 15 stretching along a tape feeding direction, and several side grooves 20. The groove 15 has an opening 19 on the atmospheric pressure side. Another similar portion to the bottom portion $14b$ is used for an upper portion thus constituting a slot path with the grooves for feeding a tape 4 therethrough.

Figure 10:
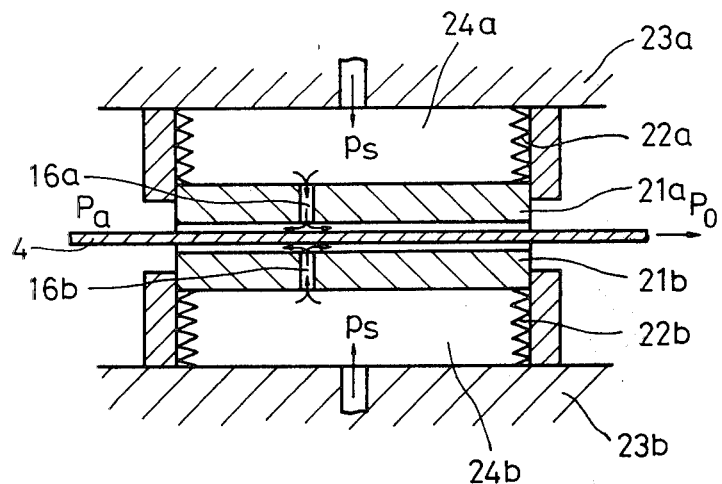
FIG. 10 is a cross-sectional side view showing another contact-free sealing member embodying the present invention.

FIG. 10 is a cross-sectional side view showing another contact-free sealing member embodying the present invention. This contact-free sealing member employs elastic supporters to obtain small gap spaces in a slot path. Two blocks 21a and 21b are respectively supported by bellows 22a and 22b, and elastically held by main blocks 23a and 23b. The blocks 21a and 21b are respectively provided with gas supply holes 16a and 16b for blowing a gas onto faces of a tape 4. Therefore, the blocks 21a and 21b are positioned above and below the tape 4 with small gap spaces, which are given by a pressure at the gap spaces, a pressure of $P_s$ in chambers 24a and 24b inside the bellows 22a and 22b, and further by an elastic force of the bellows 22a and 22b.

Figure 11:
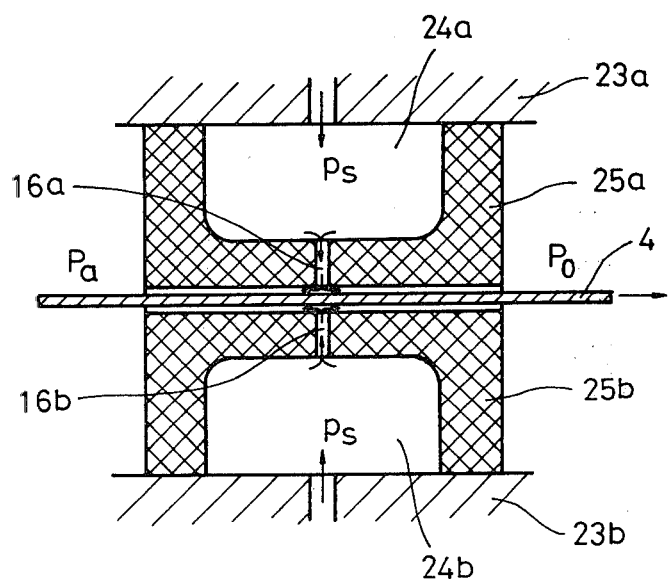
FIG. 11 is a cross-sectional side view showing still another contact-free sealing member embodying the present invention.

FIG. 11 is a cross-sectional side view showing still another contact-free sealing member embodying the present invention. A slot path is formed in hollow blocks 25a and 25b made of rubber. It is similarly possible to control sizes of small gap spaces in the slot path, like the contact-free sealing member of FIG. 10, even though tapes of different sizes in thickness are used.

In the contact-free sealing members in FIG. 10 and FIG. 11, jet is generated by the gas at the exit of the slot path, i.e. at the opening on the reduced pressure side. When the tape feeding is made with a tension of several 10 g in order not to expand it and a thickness of the tape is several 10 $\mu$m at most (i.e. rigidity of the tape is small), then the gas jet makes the tape feeding unstable and the tape clatters. This tape clattering does not only make the tape tension unstable, but also affects the feeding position of the tape in the contact-free sealing member. This causes the tape to be in contact with the inner face of the slot path, and in worst cases the tape is liable to be cut. In order to overcome these troubles, it is preferable to provide an exhaust by-path in the contact-free sealing member thereby exhausting most amount of the gas coming from the gas supply holes and decreasing the gas amount flowing into the reduced pressure chamber accompanied with the tape.

Figure 12C:
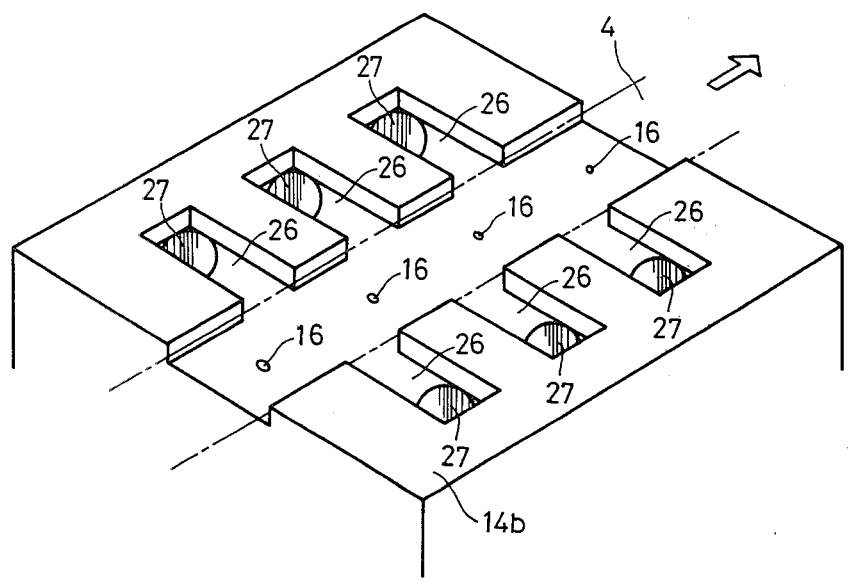
FIG. 12($a$) is a cross-sectional front view showing still another contact-free sealing member embodying the present invention FIG. 12($b$) and FIG. 12($c$) are a plan view and a perspective view of the bottom portion of the contact-free sealing member in FIG. 12($a$), respectively.

FIG. 12(a) is a cross-sectional front view showing still another contact-free sealing member embodying the present invention. FIG. 12(b) and FIG. 12(c) are a plan view and a perspective view of the bottom portion of the contact-free sealing member in FIG. 12(a), respectively. An upper block 14a and a bottom block 14b with a groove 13 of H in depth constitute a feeding path 10. Typically, the depth H of the groove 13 is set to be 40 $\mu$m with respect to a thickness of 20 $\mu$m of a tape 4. In other words, small clearances between the faces of the tape 4 and the inner face of the feeding path 10 are respectively 10 $\mu$m. The bottom block 14b is further provided with three pairs of exhaust by-paths 26 symmetrically with respect to the longitudinal direction of the tape 4 as shown in FIGS. 12(b) and 12(c).

Most amount of a gas blown out from four pairs of gas supply holes 16 is sucked by a suction means (not shown) via three pairs of exhaust holes 27. The suction means can be served by a vacuum pump used for evacuating the gas in a reduced pressure chamber. The gas is blown out from four pairs of the gas supply holes 16 onto both faces of the tape by a suitable compressor means thereby producing a hydrostatic gas bearing inside the feeding path 10. The hydrostatic gas bearing effect gives the feeding tape rigidity thereby stably feeding the tape 4 free from contact problems with the inner faces of the feeding path 10. In addition, the hole size of the gas supply holes is set to be smaller than the others, at the nearest place from the reduced pressure chamber, in order to suppress the gas flowing amount into the chamber.

By providing the exhaust holes 27 in the contact-free sealing member of this embodiment, it is possible to suppress the gas amount directly flowing into the reduced pressure chamber thus improving a degree of vacuum in the reduced pressure chamber. It is further possible to stabilize the feeding position of the tape 4 in the feeding path 10 thereby giving rise to a superior sealing effect free from the contact problems with the inner faces of the feeding path 10.

Figure 13A:
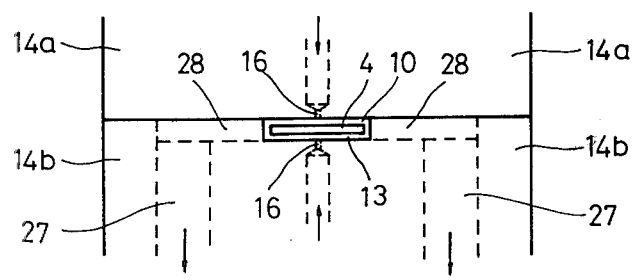
FIG. 13($a$) and FIG. 13($b$) are a cross-sectional front view of a contact-free sealing member and a plan view showing a bottom portion of the same, respectively.

In the embodiment shown in FIGS. 12(a), 12(b) and 12(c), three pairs of the exhaust by-paths and four pairs of gas supply holes 16, as shown in FIG. 13(a) and FIG. 13(b). Similar effect is also obtainable by providing one pair of exhaust by-paths 28 and exhaust holes 27 and five pairs of gas supply holes are provided in the contact-free sealing member. What is essential is that the feeding path comprises at least one pair of exhaust by-paths and at least one pair of gas supply holes.

In the abovementioned embodiments shown in FIGS. 12(a), 12(b) and 12(c), and FIGS. 13(a) and 13(b), the height of the exhaust by-paths is made identical to the opening size of the feeding path, since it is easy to produce the sealing member with such a structure. It is naturally possible to make the height of the exhaust by-paths higher than the opening size of the feeding path as shown in FIG. 14, or to make it smaller than that. But, what is the most important is to give careful consideration not to affect the tape feeding by the exhaust gas flow. For example, it is important to set the center of the feeding path identical to the center of the height of the exhaust by-paths, and to arrange the exhaust by-paths in a symmetrical manner with respect to the longitudinal direction of the feeding tape. Further, it is naturally possible to provide the exhaust by-paths in the contact-free sealing member of other embodiments than those in FIG. 12 and FIG. 13, and to obtain similar effect.

As described so far, the contact-free sealing member embodying the present invention is effective in sealing an isolated chamber of a pressure different from the atmospheric pressure. Therefore, there are a number of application fields to employ the contact-free sealing member of the present invention, for example, in producing capacitors by evaporating a metallic material on a plastic film in a vacuum chamber.

What is claimed is:

1. A contact-free sealing member for sealing an isolated chamber containing a low pressure area from an area consisting of a higher pressure, said member comprising:
    means for defining a slot path for receiving a tape-like object therethrough from a high pressure side into said isolated chamber on a low pressure side, said slot means located on a wall part of said isolated chamber and said slot means used for generating a hydrostatic gas bearing effect, a cross-sectional area of said slot means being slightly larger than that of said tape-like object,
    wherein said slot means has at least one pair of grooves in a predetermined pattern on the faces above and below said tape-like object, and that,
    one end of each of said grooves being opened to said high pressure side thereby generating a hydrostatic gas bearing effect of surface restricter type when said tape-like object is fed through said slot means.

2. A contact-free sealing member in accordance with claim 1, wherein said at least one pair of grooves comprise at least one pair of longitudinal grooves extending parallel to the tape-like object feeding direction, said grooves extending from said open end a distance equal to and up to a location approximately one-half the distance of said slot means, and that, said hydrostatic gas bearing effect of surface restricter type exists along said at least one pair of said longitudinal grooves.

3. A contact-free sealing member in accordance with claim 1 or 2, wherein said at least one pair of grooves comprise at least one pair of lateral grooves in a direction perpendicular to a tape-like object feeding direction, that, the length of said lateral grooves is less than the width of said slot means, and that, said hydrostatic gas bearing effect of surface restricter type exists along said at least one pair of said lateral grooves.

4. A contact-free sealing member in accordance with claim 1, wherein said at least one pair of grooves comprise at least one pair of longitudinal grooves parallel to a tape-like object feeding direction and up to a location approximately one-half the distance of said path means, and comprise at least one pair of lateral grooves extending from said longitudinal grooves on both sides thereof and along directions perpendicular to a tape-like object feeding direction, that, the length of said lateral grooves is less than the width of said slot means, and that, said hydrostatic gas bearing effect of surface restricter type exists along said longitudinal grooves and along said lateral grooves symmetrical to said longitudinal grooves.

5. A contact-free sealing member in accordance with claim 1 or 2, wherein a size difference between one side of an opening of said slot path and a thickness of said tape is less than 200 μm.

6. A contact-free sealing member in accordance with claim 1, wherein at least the top and bottom faces of said slot path are supported by elastic materials.

7. A contact-free sealing member in accordance with claim 1, wherein at least the top and bottom faces of said slot path are made of an elastic material.

8. A contact-free sealing member in accordance with claim 1, further comprising at least one pair of gas supply portions for blowing a gas onto both faces of said tape.

9. A contact-free sealing member in accordance with claim 8, wherein said at least one pair of gas supply portions is made of a porous material.

10. A contact-free sealing member in accordance with claim 8, further comprising at least one opening for exhausting said gas blown onto both faces of said tape.

11. A contact-free sealing member in accordance with claim 10, wherein said openings are disposed in a symmetrical way with respect to a longitudinal direction of said tape.

12. A contact-free sealing member in accordance with claim 8, wherein said gas supply portions have openings disposed substantially perpendicular to a face of said tape.

13. A contact-free sealing member for sealing an isolated chamber defined by a plurality of walls comprising:

a slot path for producing a hydrostatic gas bearing effect to permit a tape-like object to pass therethrough from a high pressure area into said isolated chamber on a low pressure side while being supported on both sides, said slot path being disposed on a wall of said isolated chamber, and the cross-sectional area of said slot path being slightly larger than that of said tape-like object, wherein said slot path has at least one groove arranged in a predetermined pattern on the faces of said slot path above and below said tape-like object, and only one end of each said at least one pair of grooves is opened to said high pressure thereby generating a hydrostatic gas bearing effect on the surface of said tape-like object when said tape-like object is fed through said slot path.

* * * * *